March 17, 1964 C. E. BENJAMIN 3,124,862

ALLOY DOUBLE-DIFFUSED SEMICONDUCTOR DEVICE

Filed Dec. 14, 1959

WITNESSES

*Edwin E. Bessler*

*Charles L. Menzemer*

INVENTOR

Charles E. Benjamin

BY

*Frederick Shapoe*

ATTORNEY

United States Patent Office 3,124,862
Patented Mar. 17, 1964

3,124,862
ALLOY DOUBLE-DIFFUSED SEMICONDUCTOR DEVICE

Charles E. Benjamin, Pittsburgh, Pa., assignor to Westinghouse Electric Corporation, East Pittsburgh, Pa., a corporation of Pennsylvania
Filed Dec. 14, 1959, Ser. No. 859,189
8 Claims. (Cl. 29—25.3)

Figure 1:
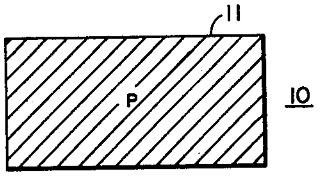

This invention relates to a process for producing semiconductor devices by the alloy double-diffusion process and to an improved method of affixing electrical contacts thereto.

U.S. Patent 2,840,497, issued to R. L. Longini, the assignee of which is the same as that of the present invention, teaches a method of preparing junctions within a wafer of semiconductor material by the alloy double-diffusion process, and reference should be had to this patent for process details. By the alloy double-diffusion process or technique, it is possible to produce narrow base regions in a wafer of semiconductive material. The alloy double-diffusion process is also referred to sometimes in the literature as, differential diffusion, alloy diffusion, alloy bulk diffusion, and post-alloy diffusion.

The problem encountered in the fabrication of semiconductor devices by the alloy double-diffusion technique is the same as that encountered in the fabrication of extremely narrow base region semiconductor devices by other means, to wit, how to make a low resistance ohmic contact to the narrow base region without adversely affecting the operating characteristics of the device.

The formation of an omhic base connection presents no problem in the type of transistor in which emitter and collector are fused or otherwise applied from opposite sides of a semiconductor wafer (excepting vapor-phase diffusion). For these configurations, some form of masking is used so that an area of the base crystal suitable for affixing a base contact thereto extends beyond the periphery of either junction.

Similarly, in diffused base transistors, where the base region is formed by vapor-phase diffusion into one side of a wafer, or in transistors in which the collector junction only is grown during crystallization, masking can be employed to limit the periphery of the emitter, and an ohmic solder contact can be made to the base of the previously converted surface layer.

In transistors with two grown junctions, such as rate-grown and melt-back transistors, and in diffused types where emitter and collector junctions extend across the whole wafer, a selected surface area can be carefully etched to expose base regions to which contacts can be made, leaving an area of the original junction on that side intact by means of masking. Alternatively, the base lead can be attached to an extremely small alloy contact which forms rectifying junctions with the emitter and collector regions, and an ohmic contact to the base layer, located on the side of the wafer in the vicinity of the base layer. This technique, however, widens the base region in the neighborhood of the contact, and reduces maximum collector voltages, and careful probing is necessary to position such a contact properly.

None of the aforedescribed techniques are reliably suitable for affixing an ohmic contact to the extremely narrow base region of a semiconductor device prepared by the alloy double-diffusion technique.

An object of the present invention is to provide a process for affixing an ohmic contact to a semiconductor device which has been prepared by the alloy double-diffusion process and which has two or more closely spaced p-n junctions within a base wafer.

Another object of the present invention is to provide a process for affixing a low resistance ohmic contact to a narrow base region of a semiconductor device without adversely affecting the operating characteristics of the device.

Another object of the present invention is to provide a semiconductor device which has been produced by the alloy double-diffusion technique and which has a narrow base region, and to which an ohmic contact has been affixed to the base region thereof without adversely affecting the electrical characteristics of the device.

Other objects of the present invention will, in part, be obvious and will, in part, appear hereinafter.

Figure 4:
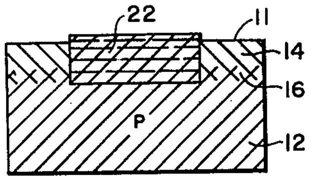
Figure 5:
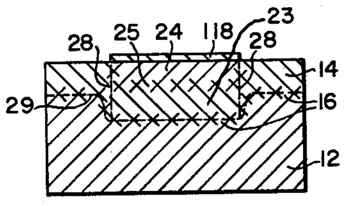
Figure 6:
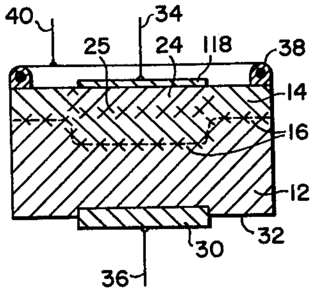

For a better understanding of the nature and the objects of the invention, reference should be had to the following detailed description and drawings in which:

FIGURE 1 is a side view, in cross section, of a wafer of a semiconductive material;

FIGS. 2 to 5, inclusive, are side views, in cross section, of the wafer of FIG. 1 undergoing various treatments in accordance with the process of this invention; and FIG. 6 is a side view, in cross section, of a semiconductor device prepared in accordance with the teachings of this invention.

In accordance with the present invention and attainment of the foregoing objects there is provided a process for preparing a semiconductor device comprising (1) establishing a zone of a second type semiconductivity in a wafer of a semiconductive material having a first type semiconductivity, said zone of second type semiconductivity extending from one or more surfaces of said wafer into the interior thereof, (2) disposing a quantity of an alloy upon the surface of the wafer having the second type semiconductivity, said alloy being comprised of at least one doping material capable of imparting said first type of semiconductivity within the wafer and at least one doping material capable of imparting said second type of semiconductivity within the wafer, said doping material capable of imparting said second type of semiconductivity within the wafer having a greater diffusion rate within the wafer than the doping material capable of imparting said first type of semiconductivity, (3) heating said alloy to a first elevated temperature above its melting point but below the melting point of the wafer, whereby, the alloy melts and dissolves a portion of the wafer, (4) cooling the molten mass to a second elevated temperature, whereby, a portion of the wafer that has been dissolved within the molten alloy resolidifies with a quantity of both the first type semiconductivity and second type semiconductivity doping material dispersed therein, (5) maintaining said second elevated temperature for a predetermined length of time, whereby, the doping material capable of imparting the second type of semiconductivity diffuses into the wafer to a first predetermined depth and the doping material capable of imparting a first type of semiconductivity diffuses into the wafer to a second predetermined depth, said second predetermined depth being less than said first predetermined depth, whereby the portions in which the second type of semiconductivity penetrates beyond the second predetermined depth have the second type of semiconductivity (6) cooling the alloy and wafer to room temperature, and (7) affixing ohmic electrical contacts to predetermined regions of said wafer, a base contact being made on that surface of the wafer having a second type semiconductivity, said base contact being physically separated from the resolidified alloy of doping material.

During the diffusion, the impurity capable of imparting the first type of semiconductivity reconverts, by overcompensation, a portion of the layer of second type semiconductivity that was formed by the vapor diffusion. As a result, an extremely important beneficial result is obtained. The resulting structure is a three region device, for example, a p-n-p device, with all three regions entirely within the wafer, and the zone of second type semiconductivity, formed by vapor diffusion, becomes continuous with the region of second type semiconductivity formed by the alloy double-diffusion procedure.

The process of this invention will be described in terms of preparing a p-n-p germanium semiconductor device. However, it will be understood that the process of this invention is equally applicable to the preparation of semiconductor devices comprised of other semiconductor materials, examples of which include silicon, and stoichiometric compounds of elements of group III and group V of the periodic table, for example, indium, gallium, aluminum, an antimony, arsensic and phosphorus, which may combine as indium arsenide, indium antimonide, gallium arsenide and the like. It will also be understood that the process of this invention is equally applicable to the preparation of p-n-p-n devices or to semiconductor devices having an intrinsic region therein, for example, a p-n-i-p or n-p-i-n device. It will be further understood that the process of this invention is equally applicable to the preparation of n-p-n and n-p-n-p devices. In the preparation of such devices a combination of doping material will be used so that the p-type impurity will have a faster diffusion rate than the n-type impurity.

With reference to FIG. 1, there is illustrated a wafer 10 comprised of single crystal p-type germanium, for example, a germanium wafer doped with at least one element selected from the group consisting of boron, aluminum, gallium and indium. The wafer 10 may have been produced and doped by any process known to those skilled in the art, for example, by pulling a single crystal rod from a suitable doped germanium melt, or by zone melting the rod and thereby converting it to a single crystal. The wafer 10 is then cut from the rod with, for example, a diamond saw. The surfaces of the wafer may then be lapped or etched or both to produce a more suitable surface after sawing.

The wafer 10 is then disposed in a diffusion furnace. The hottest zone of the diffusion furnace is at a temperature preferably within the range of from 800° C. to 900° C., and has an atmosphere of vapor of a donor doping material, for example, a phosphorus, arsenic or antimony atmosphere. The zone of the furnace within which a quantity of said donor impurity lies in solid or liquid form which gives rise to the vapors, may be at a temperature of from 100° C. to 250° C., the specific temperature being chosen to ensure the desired vapor pressure and surface concentration for diffusion into the wafer. The donor impurity diffuses into the p-type wafer 10 through top surface 11 thereof. Since the donor impurity will normally diffuse through all sides of the wafer, it is necessary to mask the sides or other surfaces through which no diffusion is desired, with, for example, SiO (silicon monoxide), which is removed after the diffusion.

It will be understood, of course, that the impurity may be allowed to diffuse through all surfaces of the wafer and the undesired layers of doped wafer removed by abrasion or etching or a combination of both.

Figure 2:
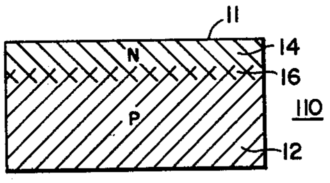

With reference to FIG. 2, there is illustrated a wafer 110 which is the p-type wafer of FIG. 1 after diffusion in which the doping impurity diffused only through the top surface of the wafer 10 of FIG. 1. The wafer 110 is comprised of a p-type region 12 and an n-type region 14. There is a p-n junction 16 between regions 12 and 14.

It will be understood that n-type region 14 may be formed in the wafer by alloying. If this precedure is followed, surplus doping alloys may be removed from the top surface of the wafer after alloying by etching. Examples of suitable etchants which may be employed to remove surplus doping material include, hydrochloric acid, and a mixture of hydrochloric acid and nitric acid.

The p-n junction 16 can also be prepared by the grown junction technique.

Figure 3:
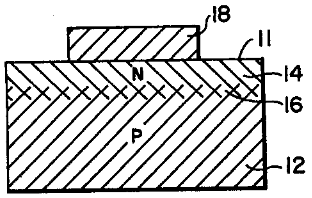

With reference to FIG. 3, an alloy 18 in the form of a pellet, foil, or the like, is disposed upon top surface 11 of the wafer 110. The alloy 18 is comprised of at least one n-type doping material component selected from group V of the periodic table, examples of which include phosphorus, arsenic, antimony; and at least one p-type doping material component selected from group III of the periodic table, examples of which include boron, aluminum, gallium and indium. The alloy 18 may also be comprised in part of a substantially neutral carrier metal component, which is neither a p- or n-type doping material, for example, gold or silver. Examples of suitabel doping alloys which may be used in accordance with the teachings of this invention for the doping of germanium include an alloy consisting of 95%, by weight, indium and 5%, by weight, antimony; 98%, by weight, indium, 1%, by weight, gallium and 1%, by weight, arsenic. An example of a suitable alloy for the doping of silicon wafers in accordance with the teachings of this invention include an alloy consisting of 99.5%, by weight, of gold, 0.4%, by weight, of antimony and 0.1% by weight, of aluminum.

In selecting a suitable alloy for use in practicing this invention, certain points must be considered. In accordance with the example given to describe the teachings of this invention, in the selection of the n- and p-type doping materials, the materials must be selected so that the n-type doping impurity will have a greater diffusion rate within the germanium wafer than the p-type doping material, and the concentration of acceptor impurity in the regrown region must be such as to be able to overcome the donor impurity concentration in the regrown and the immediately adjacent diffused regions of the wafer.

The wafer, with the alloy disposed thereon, is then placed in a furnace and a vacuum, for example, a vacuum having an absolute pressure of $10^{-5}$ mm. Hg, or a suitable protective atmosphere, for example, a hydrogen, argon, or helium atmosphere is established therein. The wafer and alloy are then heated to a temperature sufficient to melt the alloy 18. The temperature to which the alloy is heated is dependent upon its composition and the impurity distribution desired. A temperature of 820° C. has been found satisfactory when the alloy 18 is comprised of 95% by weight, indium and 5% by weight, antimony.

With reference to FIG. 4, the alloy 18 melts and wets a predetermined area of the surface 11 of the wafer. The molten alloy dissolves a portion of the wafer material under the area wet during melting. As a result of the dissolving of the wafer a depression 22 containing molten alloy is formed in the wafer. The depression 22 may be confined to the n-type region 14 or may extend through n-type region 14 to p-type region 12 as illustrated in FIG. 4.

After a predetermined quantity of the wafer has been dissolved by the molten alloy, the temperature within the furnace is lowered to a second elevated temperature, for example, to about 790° C. for the indium-antimony alloy. The protective atmosphere is maintained within the furnace. As the molten mass of alloy 18 cools, a portion of the germanium from the wafer, which has been dissolved within the molten alloy, recrystallizes. The recrystallized germanium has a quantity of both the n- and p-type doping material components from the alloy 18 included within its crystal lattice structure. This second elevated temperature is maintained for a predetermined period of time, for example, a period of as little as 15 minutes to one of from 10 to 16 hours, during which time the n- and p-type doping materials within the recrystallized germanium diffuse into the undissolved portion of the germanium wafer. Since the n-type impurity has a greater diffusion rate than the p-type impurity within the wafer, the n-type impurity will diffuse deeper into the wafer than the p-type impurity. During this diffusion, the p-type impurity reconverts by over-compensation, to p-type semiconductivity, a portion of the n-type layer 14 formed by vapor diffusion. The resulting structure is a three region device, i.e., p-n-p, with all three regions entirely within the wafer. The resultant structure is illustrated in FIG. 5.

The structure of FIG. 5 is comprised of the original p-type region 12, the original n-type region 14 and the p-n junction 16 between the regions 12 and 14. In addition, there is now an n-type region 23 and a p-type region 24 resulting from the diffusion of the n- and p-type doping from the recrystallized germanium into that portion of the wafer that was not dissolved by the molten alloy. A p-n junction 25 exists between regions 23 and 24.

Surplus p and n doping alloy, that which has not been included in the recrystallized germanium, is disposed above the p-type region 24 and is denoted as 118 in FIG. 5.

While in FIG. 5, the two n-type regions, to wit 14 and 23 have been illustrated as separate regions separated by dotted line 28, they are in fact combined so as to form one common region. The dotted line 29 indicates the p-n junction between the p-type region 12 and the continuous n-type region comprising 14 and 23. The interface between n-type region 23 and p-type region 12 is the p-n junction 16 distorted from its original location.

With reference to FIG. 6, an ohmic contact 30 is soldered, fused, brazed or otherwise joined to surface 32 of region 12. The ohmic contact 30 may be comprised of a neutral metal, an element from group III of the periodic table, or an alloy or mixture of a neutral metal and an element from group III. Electrical leads or contacts 34 and 36, for example wires which may be comprised of any electrical conductive metal such as gold, silver, copper and the like are jointed or disposed in or on the alloy layer 118 and the ohmic contact 30 respectively.

A base ring 38, comprised of for example, a tin coated molybdenum ring, is disposed upon and soldered or otherwise joined to the n-type region at surface 11 of the wafer. A base lead 40, for example, a wire of for example copper, silver or the like, is affixed to the base ring 38. It will be understood, of course, that the base contact 38 may be of some other configuration, for example, a rectangle.

The structure illustrated in FIG. 6 is an alloy double-diffused transistor in which a contact has been made to the base region, which is comprised of regions 14 and 23, without adversely affecting in any way the electrical properties of the device.

The following example is illustrative of the practice of this invention.

*Example*

A flat circular wafer of single crystal p-type germanium having a resistivity of 10 ohm-cm. and a diameter of 0.125 inch and a thickness of 5.0 mils was coated about its circular edge and bottom surface with silicon monoxide. The wafer was then disposed in a diffusion furnace. The high temperature zone of the diffusion furnace was at 900° C. and contained an arsenic vapor atmosphere. The arsensic was allowed to diffuse through the top flat surface of the wafer to a depth of 1.0 mil. The wafer was then removed from the diffusion furnace and the silicon monoxide removed from the circular edge and bottom surface.

Thereafter, a pellet having a diameter of approximately 0.010 inch was disposed centrally upon the top surface of the wafer. The alloy pellet was comprised of 95%, by weight, In+5% by weight Sb. The wafer with the alloy pellet disposed thereon was charged into an alloy furnace and heated to a temperature of approximately 820° C. The alloy pellet melted and wet a portion of the top surface of the wafer. A portion of the wafer under the area wet by the molten alloy was dissolved by the alloy. The temperature of the furnace was then lowered to approximately 790 C. During this temperature reduction, the molten alloy became super-saturated with germanium, and the excess germanium dissolved therein recrystallized with minute quantities of indium and antimony disposed within the lattice structure. This temperature was maintained for a period of approximately 14 hours whereby the antimony diffused into the wafer to produce a p-n junction at a depth of approximately 56 microns and the indium diffused into the wafer to produce second p-n junction at a depth of approximately 3 microns. The wafer was then removed from the furnace and allowed to cool to room temperature.

During the fusion operation an indium pellet was fused to the bottom surface of the wafer.

In a subsequent heating operation in an argon atmosphere at 350° C., copper wires were fused into the indium pellet and into the resolidified layer of doping alloy pellet.

An annular tin-coated molybdenum ring was simultaneously soldered to the upper surface of the wafer.

While the invention has been described with reference to particular embodiments and examples, it will be understood that modifications, substitutions and the like may be made therein without departing from its scope.

I claim as my invention:

1. A process for preparing a semiconductor device comprising, (1) vapor diffusing a doping impurity into a selected surface portion of a wafer of semiconductor material having a first type semiconductivity, to produce a zone of a second type of semiconductivity, said zone of second type semiconductivity extending from the surface portion of said wafer a predetermined distance into the interior thereof, the remainder of the surface of the wafer being of the first type of semiconductivity (2) disposing a quantity of an alloy upon that surface portion of the wafer having the second type semiconductivity, said alloy consisting of at least one doping material capable of imparting said first type of semiconductivity into the wafer, at least one doping material capable of imparting said second type of semiconductivity within the wafer and a carrier metal, said doping material capable of imparting said second type semiconductivity within the wafer having a greater diffusion rate within the wafer than the doping material capable of imparting said first type of semiconductivity, (3) heating said alloy to a temperature above its melting point but below the melting point of the wafer, whereby, the alloy melts and dissolves a portion of the wafer but does not extend through the zone of second type of semiconductivity, (4) cooling the molten mass to a second elevated temperature whereby, that portion of the wafer that has been dissolved within the molten alloy resolidifies with a quantity of both the first type and second type semiconductivity doping material dispersed therein, (5) maintaining said temperature for a predetermined length of time, whereby, the doping material capable of imparting the second type of semiconductivity diffuses into the wafer to a first predetermined depth and the doping material capable of imparting the first type of semiconductivity diffuses into the wafer to a second predetermined depth, said second predetermined depth being less than said first predetermined depth, (6) cooling the alloy and wafer to room temperature, and (7) affixing at least three electrical contacts including a base contact to said wafer, said base contact being made on that surface of the wafer having a second type semiconductivity, said base contact being physically separated from the resolidified alloy, and one of the remaining contacts being affixed to the surface of the wafer other than the said selected portion which was vapor diffused and the other contact being affixed to the resolidified alloy.

2. A process for preparing a semiconductor device comprising, (1) establishing a zone of a second type semiconductivity in a wafer of a semiconductor material having a first type of semiconductivity, said zone of second type semiconductivity being formed by vapor diffusion, said zone of second type semiconductivity extending from a selected portion of only one surface of said wafer into the interior thereof, (2) disposing a quantity of an alloy upon that surface of the wafer having the second type semiconductivity, said alloy consisting of at least one doping material capable of imparting said first type of semiconductivity into the wafer, at least one doping material capable of imparting said second type of semiconductivity within the wafer and a carrier metal, said doping material capable of imparting said second type of semiconductivity within the wafer having a greater diffusion rate within the wafer than the doping material capable of imparting said first type of semiconductivity, (3) heating said allow to a temperature above its melting point but below the melting point of the wafer, whereby, the alloy melts and dissolves a portion of the wafer but does not extend through the zone of second type of semiconductivity, (4) cooling the molten mass to a second elevated temperature, whereby, that portion of the wafer that has been dissolved within the molten alloy resolidifies with a quantity of both the first type and second type semiconductivity doping material disposed therein, (5) maintaining said temperature for a predetermined length of time, whereby, the doping material capable of imparting the second type of semiconductivity diffuses in the wafer to a first predetermined depth and the doping material capable of imparting the first type of semiconductivity diffuses in the wafer to a second predetermined depth, said first predetermined depth being greater than the depth of said zone of second type semiconductivity, said second predetermined depth being less than said first predetermined depth, (6) cooling the alloy and wafer to room temperature, and (7) affixing at least three electrical contacts including a base contact to said wafer, said base contact being made on that surface of the wafer having a second type semiconductivity, said base contact being physically separated from the resolidified alloy, and one of the remaining contacts being affixed to the surface of the wafer other than the said selected portion which was vapor diffused and the other contact being affixed to the resolidified alloy.

3. A process for preparing a semiconductor device comprising, (1) establishing by vapor diffusion a zone of a second type of semiconductivity in a wafer of a semiconductive material having a first type of semiconductivity, said zone of second type semiconductivity extending from at least a portion of one surface of said wafer into the interior thereof to a predetermined depth, (2) disposing a quantity of an alloy upon that surface of the wafer having the second type semiconductivity, said alloy consisting of at least one doping material capable of imparting said first type of semiconductivity into the wafer, at least one doping material capable of imparting said second type of semiconductivity within the wafer and a carrier metal, said doping material capable of imparting said second type semiconductivity within the wafer having a greater diffusion rate within the wafer than the doping material capable of imparting said first type of semiconductivity, (3) heating said alloy to a temperature above its melting point but below the melting point of the wafer, whereby, the alloy melts and dissolves a portion of the wafer but does not extend through the zone of second type of semiconductivity, (4) cooling the molten mass to a second elevated temperature, whereby, that portion of the wafer that has been dissolved within the molten alloy resolidifies with a quantity of both the first type and second type semiconductivity doping material dispersed therein, (5) maintaining said temperature for a predetermined length of time, whereby, the doping material capable of imparting the second type of semiconductivity diffuses into the wafer to a first predetermined depth and the doping material capable of imparting the first type of semiconductivity diffuses into the wafer to a second predetermined depth, said first predetermined depth being less than the depth of the zone of second type semiconductivity formed by vapor diffusion, said second predetermined depth being less than said first predetermined depth, (6) cooling the alloy and wafer to room temperature, and (7) affixing at least three electrical contacts including a base contact to said wafer, said base contact being made on that surface of the wafer having a second type semiconductivity, said base contact being physically separated from the resolidified alloy, and one of the remaining contacts being affixed to the surface of the wafer other than the said selected portion which was vapor diffused and the other contact being affixed to the resolidified alloy.

4. A process for preparing a semiconductor device comprising, (1) establishing by vapor diffusion a zone of n-type semiconductivity in a wafer of a semiconductive material having a p-type semiconductivity, said zone of n-type semiconductivity extending from one surface of said wafer into the interior thereof, (2) disposing a quantity of an alloy upon that surface of the wafer having the n-type semiconductivity, said alloy consisting of at least one doping material capable of imparting a p-type of semiconductivity into the wafer, at least one doping material capable of establishing an n-type of semiconductivity within the wafer and a carrier metal, said doping material capable of imparting said n-type semiconductivity within the wafer having a greater diffusion rate within the wafer than the doping material capable of establishing said p-type of semiconductivity, (3) heating said alloy to a temperature above its melting point but below the melting point of the wafer, whereby, the alloy melts and dissolves a portion of the wafer but does not extend through the zone of n-type semiconductivity, (4) cooling the molten mass to a second elevated temperature whereby that portion of the wafer that has been dissolved within the molten alloy resolidifies with a quantity of both the p-type and the n-type semiconductivity doping material dispersed therein, (5) maintaining said temperature for a predetermined length of time, whereby, the doping material capable of imparting the n-type of semiconductivity diffuses into the wafer to a first predetermined depth and the doping material capable of imparting the p-type of semiconductivity diffuses into the wafer to a second predetermined depth, said second predetermined depth being less than said first predetermined depth, (6) cooling the alloy and wafer to room temperature, and (7) affixing at least three electrical contacts including a base contact to said wafer, said base contact being made on that surface of the wafer having the n-type semiconductivity, said base contact being physically isolated from the resolidified alloy, and one of the remaining contacts being affixed to the surface of the wafer other than the said selected portion which was vapor diffused and the other contact being affixed to the resolidified alloy.

5. A process for preparing a semiconductor device comprising, (1) establishing by vapor diffusion a zone of n-type semiconductivity in a wafer of a semiconductive material having a p-type semiconductivity, said zone of n-type semiconductivity extending from one surface of said wafer into the interior thereof, (2) disposing a quantity of an alloy upon that surface of the wafer having the n-type semiconductivity, said alloy consisting of at least one doping material capable of imparting a p-type of semiconductivity into the wafer, at least one doping material capable of establishing an n-type of semiconductivity within the wafer and a carrier metal, said doping material capable of imparting said n-type semiconductivity within the wafer having a greater diffusion rate within the wafer than the doping material capable of imparting said first type of semiconductivity, (3) heating said alloy to a temperature above its melting point but below the melting point of the wafer, whereby, the alloy melts and dissolves a portion of the wafer but does not extend through the zone of n-type semiconductivity, (4) cooling the molten mass to a second elevated temperature, whereby, that portion of the wafer that has been dissolved within the molten alloy resolidifies with a quantity of both the p-type and n-type semiconductivity doping material dispersed therein, (5) maintaining said temperature for a predetermined length of time, whereby, the doping material capable of imparting the n-type of semiconductivity diffuses into the wafer to a first predetermined depth, and the doping material capable of imparting the p-type of semiconductivity diffuses in the wafer to a second predetermined depth, said first predetermined depth being greater than the depth of said n-type zone formed by vapor diffusion, said second predetermined depth being less than said first predetermined depth, (6) cooling the alloy and wafer to room temperature, and (7) affixing at least three electrical contacts to including a base contact said wafer, said base contact being made on that surface of the wafer having the n-type semiconductivity, said base contact being physically separated from the resolidified alloy.

6. A process for preparing a semiconductor device comprising, (1) establishing by vapor diffusion a zone of p-type semiconductivity in a wafer of a semiconductive material having an n-type semiconductivity, said zone of p-type semiconductivity extending from one surface of said wafer into the interior thereof, (2) disposing a quantity of an alloy upon that surface of the wafer having the p-type semiconductivity, said alloy consisting of at least one doping material capable of imparting an n-type of semiconductivity into the wafer, at least one doping material capable of establishing a p-type of semiconductivity within the wafer, and a carrier metal said doping material capable of imparting said p-type simiconductivity within the wafer having a greater diffusion rate within the wafer than the doping material capable of establishing said n-type of semiconductivity, (3) heating the alloy to a temperature above its melting point but below the melting point of the wafer, whereby, the alloy melts and dissolves a portion of the wafer but does not extend through the zone of p-type semiconductivity, (4) cooling the molten mass to a second elevated temperature, whereby, that portion of the wafer that has been dissolved within the molten alloy resolidifies with a quantity of both the n-type and p-type semiconductive doping material dispersed therein, (5) maintaining said temperature for a predetermined length of time, whereby, the doping material capable of imparting the p-type of semiconductivity diffuses in the wafer to a first predetermined depth and the doping material capable of imparting the n-type of semiconductivity diffuses in the wafer to a second predetermined depth, said second predetermined depth being less than said first predetermined depth, (6) cooling the alloy and wafer to room temperature, and (7) affixing at least three electrical contacts including a base contact to said wafer, said base contact being made on that surface of the wafer having the p-type semiconductivity, said base contact being physically separated from the resolidified alloy.

7. A process for preparing a semiconductor device comprising, (1) establishing by vapor diffusion a zone of p-type semiconductivity in a wafer of a semiconductive material having an n-type semiconductivity, said zone of p-type semiconductivity extending from one surface of said wafer into the interior thereof, (2) disposing a quantity of an alloy upon that surface of the wafer having the p-type semiconductivity, said alloy consisting of at least one doping material capable of imparting an n-type of semiconductivity into the wafer, at least one doping material capable of establishing a p-type of semiconductivity within the wafer and a carrier metal, said doping material capable of imparting said p-type semiconductivity within the wafer having a greater diffussion rate within the wafer than the doping material capable of imparting said n-type of semiconductivity, (3) heating said alloy to a temperature above its melting point but below the melting point of the wafer, whereby, the alloy melts and dissolves a portion of the wafer but does not extend through the zone of p-type semiconductivity, (4) cooling the molten mass to a second elevated temperature, whereby, that portion of the wafer that has been dissolved within the molten alloy resolidifies with a quantity of both the n-type and p-type semiconductive doping materials dispersed therein, (5) maintaining said temperature for a predetermined length of time, whereby, the doping material capable of imparting the p-type of semiconductivity diffuses into the wafer to a first predetermined depth and the doping material capable of imparting the n-type of semiconductivity diffuses into the wafer to a second predetermined depth, said first predetermined depth being greater than the depth of said zone of p-type semiconductivity established by vapor diffusion and forming a continuation thereof, said second predetermined depth being less than said first predetermined depth, (6) cooling the alloy and wafer to room temperature, and (7) affixing at least three electrical contacts including a base contact to said wafer, said base contact being made on that surface of the wafer having the p-type semiconductivity, said base contact being physically separated from the resolidified alloy.

8. A process for preparing a semiconductor device comprising, (1) establishing by vapor diffusion a zone of a second type semiconductivity in a wafer of a semiconductive material having a first type semiconductivity, said wafer of semiconductive material being comprised of a material selected from the group consisting of silicon, germanium, and stoichiometric compounds of elements of group III and group V of the periodic table, said zone of second type semiconductivity extending from one surface of said wafer into the interior thereof, (2) disposing a quantity of an alloy upon that surface of the wafer having the second type semiconductivity, said alloy consisting of at least one doping material capable of imparting said first type of semiconductivity into the wafer, at least one doping material capable of imparting said second type of semiconductivity within the wafer and a carrier metal, said doping material capable of imparting said second type of semiconductivity within the wafer having a greater diffusion rate within the wafer than the doping material capable of imparting said first type of semiconductivity, (3) heating said alloy to a temperature above its melting point but below the melting point of the wafer, whereby, the alloy melts and dissolves a portion of the wafer but does not extend through the zone of second type of semiconductivity, (4) cooling the mass to a second elevated temperature, whereby, that portion of the wafer that has been dissolved within the molten alloy resolidifies with a quantity of both the first type and second type semiconductive doping material dispersed therein, (5) maintaining said temperature for a predetermined length of time, whereby, the doping material capable of imparting the second type of semiconductivity diffuses in the wafer to a first predetermined depth and the doping material capable of imparting the first type of semiconductivity diffuses in the wafer to a second predetermined depth, said second predetermined depth being less than said first predetermined depth (6) cooling the alloy and wafer to room temperature, and (7) affixing at least three electrical contacts including a base contact to said wafer, said base contact being made on that surface of the wafer having a second type semiconductivity, said base contact being physically separated from the resolidified alloy.

References Cited in the file of this patent

UNITED STATES PATENTS

| | | |
|---|---|---|
| 2,829,422 | Fuller | Apr. 8, 1958 |
| 2,842,723 | Koch et al. | July 8, 1958 |
| 2,842,831 | Pfann | July 15, 1958 |
| 2,849,664 | Beale | Aug. 26, 1958 |

FOREIGN PATENTS

| | | |
|---|---|---|
| S14,639 | Germany | July 27, 1956 |

(Addition to patent application S40,325)